United States Patent [19]
McGowan et al.

[11] Patent Number: 5,744,980
[45] Date of Patent: Apr. 28, 1998

[54] FLEXIBLE, HIGH-PERFORMANCE STATIC RAM ARCHITECTURE FOR FIELD-PROGRAMMABLE GATE ARRAYS

[75] Inventors: John E. McGowan, Sunnyvale; William C. Plants, Santa Clara, both of Calif.; Joel D. Landry, Colorado Springs, Colo.; Sinan Kaptanoglu, San Carlos; Warren K. Miller, Palo Alto, both of Calif.

[73] Assignee: Actel Corporation, Sunnyvale, Calif.

[21] Appl. No.: 603,597

[22] Filed: Feb. 16, 1996

[51] Int. Cl.$^6$ ................................................ H03K 19/177
[52] U.S. Cl. ................................................ 326/40; 326/41
[58] Field of Search ........................................ 326/40, 41

[56] References Cited

U.S. PATENT DOCUMENTS

| | | | |
|---|---|---|---|
| 3,816,725 | 6/1974 | Greer | 235/152 |
| 3,818,452 | 6/1974 | Greer | 340/166 |
| 3,849,638 | 11/1974 | Greer | 235/152 |
| 3,987,287 | 10/1976 | Cox et al. | 235/152 |

(List continued on next page.)

FOREIGN PATENT DOCUMENTS

| | | | |
|---|---|---|---|
| 0 162 529 | 3/1989 | European Pat. Off. | |
| 0 410 759 A2 | 7/1990 | European Pat. Off. | H03K 19/173 |
| 0 394 575 | 10/1990 | European Pat. Off. | |
| 0 452 091 | 10/1991 | European Pat. Off. | |
| 0 507 507 A2 | 3/1992 | European Pat. Off. | H03K 19/177 |
| 39 27 033 | 3/1990 | Germany | |
| 87/02827 | 5/1987 | WIPO | |

OTHER PUBLICATIONS

Xilinx, 1994 Data Book, pp. 2–13.

Fujitsu, "CMOS Channelless Gate Arrays", 1989 Data Book, pp. 2–402 to 2–409.

Hsieh, et al., "Third–Generation Architecture Boosts Speed and Density of Field–Programmable Gate Arrays", IEEE, 1990, Custom Integrated Circuits Conference, pp. 31.2.1–31.2.7.

(List continued on next page.)

*Primary Examiner*—Edward P. Westin
*Assistant Examiner*—Richard Roseen
*Attorney, Agent, or Firm*—D'Alessandro & Ritchie

[57] ABSTRACT

A field programmable gate array architecture comprises a plurality of horizontal and vertical routing channels each including a plurality of interconnect conductors. Some interconnect conductors are segmented by user-programmable interconnect elements, and some horizontal and vertical interconnect conductors are connectable by user-programmable interconnect elements located at selected intersections between them. An array of rows and columns of logic function modules each having at least one input and one output is superimposed on the routing channels. The inputs and outputs of the logic function modules are connectable to ones of the interconnect conductors in either or both of the horizontal and vertical routing channels. At least one column of random access memory blocks is disposed in the array. Each random access memory block spans a distance of more than one row of the array such that more than one horizontal routing channel passes therethrough and is connectable to adjacent logic function modules on either side thereof. Each of the random access memory blocks has address inputs, control inputs, data inputs, and data outputs. User-programmable interconnect elements are connected between the address inputs, control inputs, data inputs, and data outputs of the random access memory blocks and selected ones of the interconnect conductors in the horizontal routing channels passing therethrough. Programming circuitry is provided for programming selected ones of the user-programmable interconnect conductors to connect the inputs and outputs of the logic function modules to one another and to the address inputs, control inputs, data inputs, and data outputs of the random access memory blocks.

14 Claims, 4 Drawing Sheets

U.S. PATENT DOCUMENTS

| | | |
|---|---|---|
| 4,293,783 | 10/1981 | Patil . |
| 4,433,331 | 2/1984 | Kollaritsch .................. 340/825.83 |
| 4,642,487 | 2/1987 | Carter . |
| 4,677,318 | 6/1987 | Veenstra . |
| 4,701,922 | 10/1987 | Kuboki et al. . |
| 4,706,208 | 11/1987 | Helms ............................ 364/580 |
| 4,713,557 | 12/1987 | Carter . |
| 4,717,912 | 1/1988 | Harvey et al. ................. 340/825.83 |
| 4,742,252 | 5/1988 | Agrawal . |
| 4,758,745 | 7/1988 | Elgamal et al. . |
| 4,758,985 | 7/1988 | Carter ............................. 365/94 |
| 4,763,020 | 8/1988 | Takata et al. . |
| 4,786,904 | 11/1988 | Graham, III et al. ........... 340/825 |
| 4,789,951 | 12/1988 | Birkner et al. ................. 364/716 |
| 4,821,176 | 4/1989 | Ward et al. ..................... 364/200 |
| 4,823,181 | 4/1989 | Mohsen et al. ................. 357/51 |
| 4,847,612 | 7/1989 | Kaplinsky ...................... 340/825.8 |
| 4,847,732 | 7/1989 | Stopper et al. ................. 361/395 |
| 4,857,774 | 8/1989 | El-Ayat et al. . |
| 4,870,300 | 9/1989 | Nakaya et al. . |
| 4,870,302 | 9/1989 | Freeman . |
| 4,871,930 | 10/1989 | Wong et al. . |
| 4,873,459 | 10/1989 | El Gamal et al. . |
| 4,903,223 | 2/1990 | Norman et al. ................. 364/716 |
| 4,910,417 | 3/1990 | El Gamal et al. . |
| 4,914,055 | 4/1990 | Gordon et al. .................. 437/192 |
| 4,963,768 | 10/1990 | Agrawal et al. . |
| 4,963,770 | 10/1990 | Keida . |
| 5,001,368 | 3/1991 | Cliff et al. . |
| 5,003,200 | 3/1991 | Sakamoto . |
| 5,015,885 | 5/1991 | El Gamal et al. . |
| 5,019,736 | 5/1991 | Furtek . |
| 5,023,606 | 6/1991 | Kaplinsky ...................... 340/825.8 |
| 5,055,718 | 10/1991 | Galbraith et al. . |
| 5,070,384 | 12/1991 | McCollum et al. ............. 357/51 |
| 5,073,729 | 12/1991 | Greene et al. . |
| 5,083,083 | 1/1992 | El-Ayat et al. ................. 324/158 |
| 5,122,685 | 6/1992 | Chan et al. . |
| 5,132,571 | 7/1992 | McCollum et al. . |
| 5,140,193 | 8/1992 | Freeman et al. . |
| 5,144,166 | 9/1992 | Camarota et al. . |
| 5,151,623 | 9/1992 | Agrawal . |
| 5,171,715 | 12/1992 | Husher et al. .................. 437/195 |
| 5,172,014 | 12/1992 | El Ayat et al. . |
| 5,181,096 | 1/1993 | Forouhi .......................... 257/530 |
| 5,187,393 | 2/1993 | El Gamal et al. . |
| 5,220,213 | 6/1993 | Chan et al. . |
| 5,233,539 | 8/1993 | Agrawal et al. ................ 364/489 |
| 5,245,227 | 9/1993 | Furtek et al. . |
| 5,258,668 | 11/1993 | Cliff et al. . |
| 5,260,611 | 11/1993 | Cliff et al. . |
| 5,291,079 | 3/1994 | Goetting . |
| 5,302,866 | 4/1994 | Chiang et al. . |
| 5,313,119 | 5/1994 | Cooke et al. . |
| 5,331,226 | 7/1994 | Goetting . |
| 5,400,262 | 3/1995 | Mohsen .......................... 364/489 |
| 5,548,228 | 8/1996 | Madurawe ...................... 326/41 |
| 5,559,450 | 9/1996 | Ngai et al. ...................... 326/40 |
| 5,559,971 | 9/1996 | Hsieh et al. .................... 326/41 |
| 5,570,040 | 10/1996 | Lytle et al. ..................... 326/41 |

OTHER PUBLICATIONS

Cartier, "Implementing FIFOs in XC4000E RAM", Xilinx, Inc., 1995, pp. 1–15.

Wilson, "Altera Puts Memory Into Its Flex PLDs", E.E. Times, pp. 1 & 108.

"Embedded Programmable Architecture Targets Mainstream ASIC Designers", Apr., 1995, Computer Design, pp. 80 & 96.

"Altera Targets High–End ASIC Designs with FLEX 10K Architecture", news release Business Wire, Mar. 20, 1995, pp. 1–2.

"Flex 10K Embedded Programmable Logical Family", Altera Corporation, Preliminary Information, pp. 6–9.

Kawana, et al., "An Efficient Logic Block Interconnect Architecture for User–Reprogrammable Gate Array", 1990, IEEE, Custom Integrated Circuits Conference, pp. 31.3.1–31.3.4.

FLEXIBLE, HIGH-PERFORMANCE STATIC RAM ARCHITECTURE FOR FIELD-PROGRAMMABLE GATE ARRAYS

BACKGROUND OF THE INVENTION

1. Field of the Invention

The present invention relates to field programmable gate array (FPGA) integrated circuits. More particularly, the present invention relates to FPGA integrated circuits including static random access memory devices within the array of logic modules.

2. The Prior Art

As integrated circuit technology advances, geometries shrink, performance improves, and densities increase. This is especially true in logic products such as Application Specific Integrated Circuits (ASICs), Complex Programmable Logic Devices (CPLDs), and Field Programmable Gate Arrays (FPGAs). This trend makes the design of systems of ever increasing complexity at ever decreasing cost feasible. One of the requirements of these systems is fast, flexible, inexpensive memory for a variety of purposes such as register files, FIFOs, scratch pads, look-up tables, etc. There are significant cost and performance savings to be obtained by integrating this functionality directly into these types of logic products.

Using external SRAMs with FPGA designs is undesirable for several reasons. Separate memory chips are expensive, require additional printed circuit board space, and consume I/O pins on the FPGA itself. Also, a separate memory chip is required to implement each memory function, thereby further increasing the cost.

These difficulties have resulted in various attempts by FPGA manufacturers to include on-chip SRAM resources on their devices. However, such attempts have been less than desirable with regards to cost, performance, and flexibility.

One such attempt is to simply build the SRAM out of array logic and routing resources, using the available logic blocks as gates and latches and using programmable interconnect to connect them. This is extremely costly and slow because it offers no density improvement over ordinary FPGA functionality, consumes a considerable amount of logic array resources, and the critical paths are quite long for even a small memory block.

A variation on this theme (Xilinx 4000 Series) is available on SRAM based FPGAs where the configuration information for the logic blocks and programmable interconnect is stored in SRAM cells. Some of these SRAM cells are used by configuring the logic blocks as small (16 bit) SRAM blocks. While this distributed SRAM approach is an improvement in density and is flexible for building larger memories, it is still slow and consumes logic array resources. The necessary overhead circuitry was sufficiently large that Xilinx actually removed it when they developed their low cost 4000-D parts.

Another approach recently announced by Altera is to put dedicated memory blocks on board the FPGAs. This has been used to produce large (2K bit), dense, flexible SRAMs with very poor performance. These dedicated memory blocks are exceedingly slow (25 ns read access for an on-chip 2K CMOS memory). These memory blocks are single ported, which, while good for density, negatively impacts the speed of some memory functions like FIFOs and register files even more. Further, these memory blocks are limited in extent by the programmable interconnect channels (the interconnect density may exceed that of the rest of the array, thus hindering routeability), and are overly flexible (having too many options hurts speed and routeability).

Another approach to SRAM memory in FPGA applications is found in "Architecture of Centralized Field-Configurable Memory", Steven J. E. Wilton, et. al., from the minutes of the 1995 FPGA Symposium, p. 97. This approach involves a large centralized memory which can be incorporated into FPGA. The centralized memory comprises several SRAM arrays which have programmable local routing interconnect which are used exclusively by the centralized memory block. The local routing interconnects are used to make efficient the configuration of the SRAMs within the centralized memory block.

Clearly there is a need for an SRAM architecture indigenous to FPGA logic arrays which will provide high performance, density approaching the inherent SRAM density of the semiconductor process, reasonable flexibility, and routing density comparable to the rest of the logic array. Such an architecture would share some of the characteristics of the distributed and dedicated block SRAMs reported in the prior art while incorporating additional characteristics further optimizing it for use in FPGA logic arrays.

BRIEF DESCRIPTION OF THE INVENTION

The presently preferred embodiment of the invention comprises a flexible, high-performance memory integrated into an FPGA architecture. A given FPGA integrated circuit includes a plurality of independent RAM blocks, the number of which is based on the size of the FPGA array. According to a presently preferred embodiment of the invention, each integrated circuit may include from eight to fourteen RAM blocks, depending on the size of the array. Each block contains 256 bits of RAM arranged, for example, as 32×8 or 64×4, and is fully independent from the other blocks.

Connections are made to a block using antifuse connections to horizontal metal routing channels in the same way that connections are made to logic modules. In accordance with one feature of the present invention, SRAM blocks span more than one logic module row. According to an exemplary actual layout of an architecture according to the present invention, the SRAM block differs from the logic modules in that an SRAM block spans four module rows. Thus, a block is associated with five routing channels.

The SRAM blocks are preferably placed into two dedicated SRAM columns, at intermediate locations in the array that are optimal for automated place-and-route algorithms. Neighboring logic modules can be used in conjunction with the SRAM to produce depth and/or width expansion.

The aforementioned horizontal routing channels pass through the SRAM block allowing logic modules on either side to connect to each other as if the SRAM block were not there. This is quite different from the distributed or dedicated prior-art SRAM included on FPGA integrated circuits because the SRAM block extents are not bounded or limited by the routing channels and the routing channels are not interrupted by the SRAM blocks. In addition, the inputs and outputs to the memory block are distributed amongst the five routing channels in order to mimic the routing density of the logic array as a whole. This feature of the present invention is crucial to maintaining routeability, since if the density of the signals into and out of the SRAM blocks were too high, it would create blockages in the routing channels which could make it difficult or impossible for the different parts of the array to connect, severely limiting the useability of the FPGA. There are also a variety of features included in the structure of the SRAM block itself which facilitate its use inside an FPGA logic array.

BRIEF DESCRIPTION OF THE DRAWING FIGURES

FIG. 1 is a block diagram of an FPGA array with dedicated SRAM blocks according to the present invention.

FIG. 2. is a more detailed block diagram of a portion of the FPGA array of FIG. 1, showing more detail of the manner in which a typical SRAM block fits into the interconnection scheme of the architecture.

DETAILED DESCRIPTION OF A PREFERRED EMBODIMENT

Figure 1:
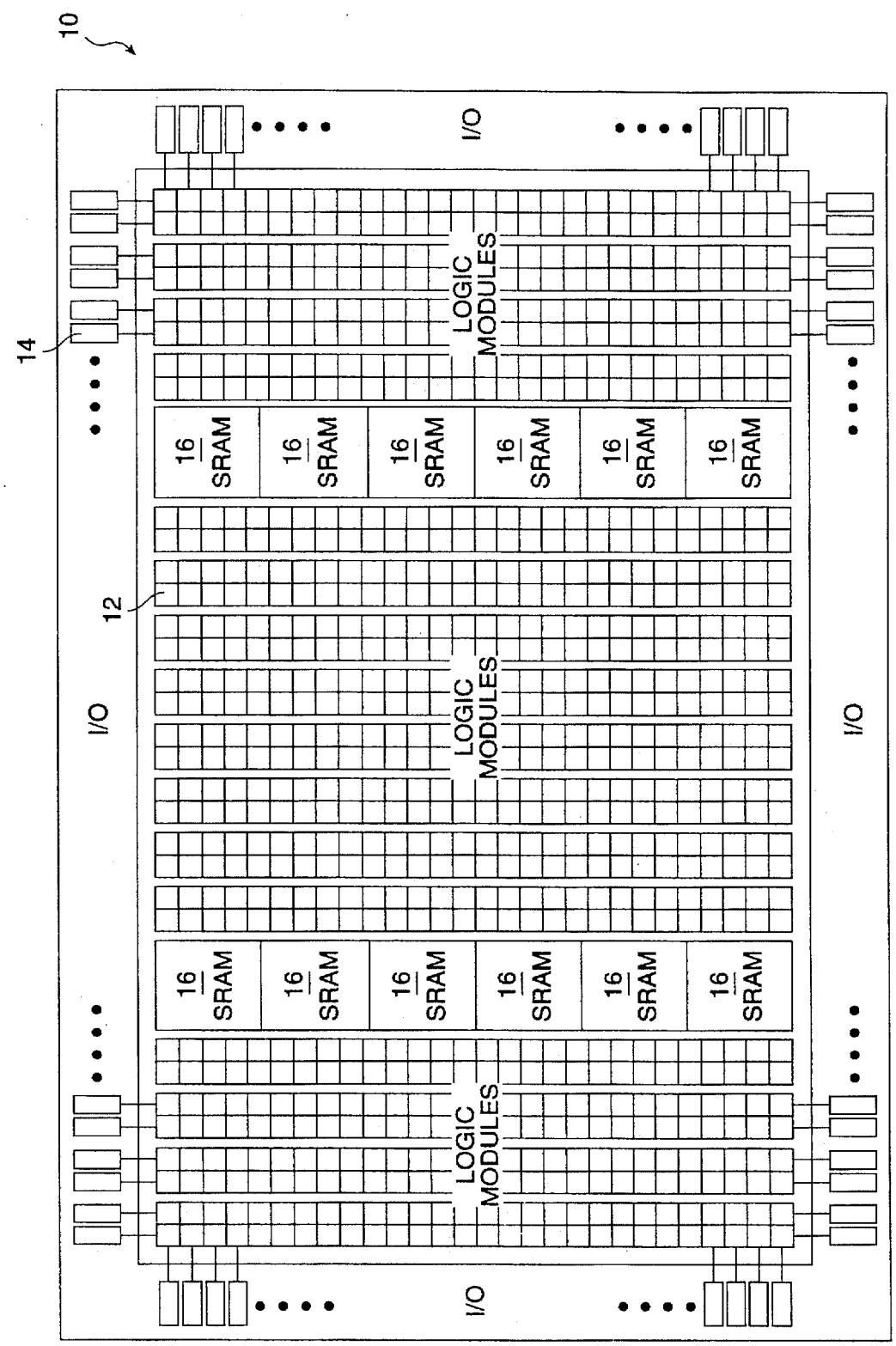

Those of ordinary skill in the art will realize that the following description of the present invention is illustrative only and not in any way limiting. Other embodiments of the invention will readily suggest themselves to such skilled persons.

The presently preferred embodiment of the invention comprises a flexible, high-performance memory integrated into an FPGA architecture. A block diagram of a typical architecture according to the present invention is presented in FIG. 1. FPGA architecture 10 includes a plurality of logic function modules 12 (shown as a plurality of squares, an exemplary one of which is designated by reference numeral 12) arranged in an array comprising a plurality of rows and columns. Those of ordinary skill in the art will readily recognize that the terms "row" and "column" used in both the specification and the claims are interchangeable and equivalent; merely rotating the array 90° converts a row into a column. Arrays formed according to the present invention may or may not be symmetrical in the row and column dimensions.

Logic function modules 12 may be any one of a variety of circuits, including, for example, the logic modules disclosed in U.S. Pat. Nos. 4,758,745; 4,873,459; 4,910,417; 5,015,885; 5,451,887 and 5,477,165 assigned to the same assignee as the present invention.

As shown in FIG. 1, selected ones of the logic function modules 12 are hardwired to peripheral I/O circuitry (an exemplary one of which is designated by reference numeral 14) although those of ordinary skill in the art will recognize that this is not necessary. Such I/O circuitry, used to transport signals onto and off of the integrated circuit containing the FPGA array, is known in the art. Details of such I/O circuitry are not provided herein to avoid unnecessarily complicating the disclosure and obscuring the present invention. Alternately, peripheral I/O circuitry could be connectable to the interior of the array by using interconnect conductors as is known in the art.

According to the present invention, a plurality of SRAM blocks 16 are disposed in the array along with the logic function modules 12. In the illustrative embodiment depicted in FIG. 1, two columns of six SRAM blocks are disposed in the array. Those of ordinary skill in the art will recognize that FIG. 1 is only illustrative, and a requirement that SRAM blocks 16 span entire columns according to the present invention is not to be implied. Such skilled persons will also realize that, while the instant disclosure is made in terms of SRAM blocks spanning columns, the concept disclosed and claimed herein applies equally to such SRAM blocks spanning rows.

For the size of SRAM block employed in the array of FIG. 1, each SRAM block 16 spans the height of four logic function modules 12. The SRAM blocks 16 in the illustrative embodiment of FIG. 1 are placed into two dedicated SRAM columns, at intermediate locations in the array. For any given array, persons skilled in the art may choose locations which are optimal for automated place-and-route algorithms. Neighboring logic function modules 12 can be used in conjunction with the SRAM blocks 16 to produce depth and/or width expansion.

Absolute numbers of elements included in the architecture of the present invention is not critical. Thus, a given FPGA integrated circuit may include, for example, eight to fourteen independent SRAM blocks, the number of which is based on the size of the FPGA array. According to a presently preferred embodiment of the invention, each block contains 256 bits of SRAM configured, for example, as 32×8 or 64×4, and is fully independent from the other blocks. Persons of ordinary skill in the art will recognize that other numbers of RAM blocks may be utilized.

Figure 2:
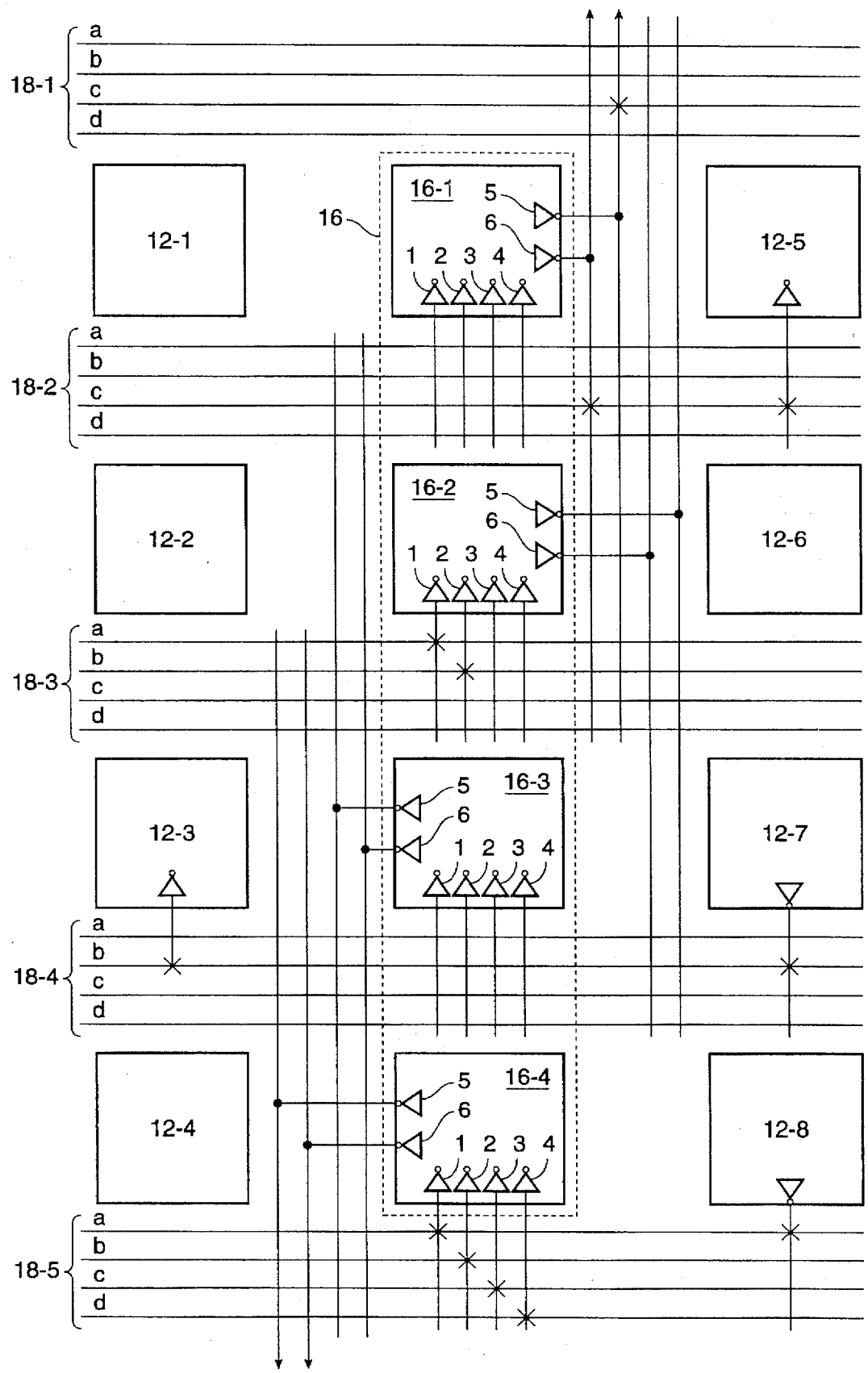

Referring now to FIG. 2, a more detailed block diagram of a portion of the array 10 of FIG. 1 shows the interconnectivity between the SRAM blocks 16 and the logic function modules 12. FIG. 2 illustrates how connections are made to and from each SRAM block 16 using user-programmable interconnect elements to make selective connections to individual metal interconnect conductors disposed in routing channels in the same way that connections are made between logic function modules 12.

In FIG. 2, an exemplary SRAM block 16 is shown broken up into four segments 16-1, 16-2, 16-3, and 16-4 to illustrate the distribution of its inputs and outputs into the interconnect architecture of the array of the present invention.

According to an exemplary actual layout of an architecture within the scope of the present invention, the SRAM blocks 16 differ in size from the logic function modules 12 in that an SRAM block 16 spans four module rows (as shown in FIG. 1). In FIG. 2, there are four logic function modules 12-1, 12-2, 12-3, and 12-4 located to the left of SRAM block segments 16-1, 16-2, 16-3, and 16-4, and four logic function modules 12-5, 12-6, 12-7, and 12-8 located to the right of SRAM block segments 16-1, 16-2, 16-3, and 16-4. Thus, each SRAM block 16 is associated with five routing channels (numbered 18-1, 18-2, 18-3, 18-4, and 18-5) which are associated with the four rows of logic function modules proximately located to the SRAM block 16. As shown in FIG. 2, each of the five routing channels comprises four interconnect conductors, labeled a, b, c, and d in each routing channel. Where individual conductors are mentioned herein, they will be identified accordingly (e.g., 18-1b, 18-3a, etc.) Persons of ordinary skill in the art will understand that the use of four conductors are merely illustrative and that the number four was chosen to both illustrate the invention and avoid over complicating the drawing figure which would unnecessarily obscure the disclosure.

Those of ordinary skill in the art will also recognize that the particular arrangement of size and span of the distributed SRAM block 16 comprising SRAM block segments 16-1, 16-2, 16-3, and 16-4 shown in the illustrative embodiment of the present invention does not limit the invention to the disclosed embodiment. Such skilled persons will readily appreciate that other sizes of SRAM memory blocks may be employed without departing from the concepts of the present invention.

The horizontal routing channels 18-1, 18-2, 18-3, 18-4, and 18-5 are associated with the SRAM block segments 16-1, 16-2, 16-3, and 16-4. The horizontal routing channels 18-2, 18-3, and 18-4 pass through SRAM block segments 16-1, 16-2, 16-3, and 16-4, and horizontal routing channels 18-1 and 18-5 pass between adjacent SRAM blocks 16 in the SRAM column. This allows logic modules on either side to connect to each other as if the SRAM block 16 comprising SRAM block segments 16-1, 16-2, 16-3, and 16-4 was not there. This is quite different from the distributed or dedicated prior-art SRAM included on FPGA integrated circuits because the SRAM block extents are not bounded or limited by the routing channels and the routing channels are not interrupted by the SRAM blocks 16. In addition, the inputs and outputs to the memory block are distributed amongst the five routing channels in order to mimic the routing density of the logic array as a whole.

This feature of the present invention is crucial to maintaining routeability, since if the density of the signals into and out of the SRAM blocks 16 were too high, it would create blockages in the routing channels which could make it difficult or impossible for the different parts of the array to connect, severely limiting the useability of the FPGA. There are also a variety of features included in the structure of the SRAM block 16 itself which facilitate its use inside an FPGA logic array. The distribution of SRAM block 16 inputs and outputs according to the present invention will now be disclosed in more detail.

The address and data inputs of SRAM block Segments 16-1, 16-2, 16-3, and 16-4 are shown as input inverters for ease of illustration. Four illustrative inputs 1, 2, 3, and 4 (which may be either control, data or address inputs) are shown for each of SRAM block segments 16-1, 16-2, 16-3, and 16-4, but those of ordinary skill in the art will understand that the total number of control, address and data inputs employed in any actual implementation of the present invention will vary and will be dictated by the width of a data word in the SRAM and the number of address locations needed.

As shown in FIG. 2, the inputs of the SRAM block 16 are distributed among the four SRAM block segments 16-1, 16-2, 16-3, and 16-4 in order to optimize routability. Each input conductor intersects the interconnect conductors in one of the wiring channels 18-1, 18-2, 18-3, 18-4, and 18-5. User-programmable interconnect elements are provided at some or all of the intersections. Such interconnect elements may be antifuses, pass transistors controlled by RAM cells, non-volatile memory cells, etc., all of which are well known in the art. These user-programmable interconnect elements are not shown in FIG. 2 due to space limitations. In addition, the outputs (two illustrative outputs labeled 5 and 6 are shown for each SRAM block segment 16-1, 16-2, 16-3, and 16-4) of the SRAM block 16 are distributed among the wiring channels 18-1, 18-2, 18-3, 18-4, and 18-5. In the embodiment shown in FIG. 2, each output conductor spans the individual interconnect conductors of four wiring channels, two above, and two below the output. Thus, the outputs from SRAM block segment 16-1 intersect the four interconnect conductors of wiring channels 18-1, 18-2, and 18-3, as well as continuing on to a wiring channel located above the top of the drawing figure. Similarly, the outputs from SRAM block segment 16-2 intersect the four interconnect conductors of wiring channels 18-1, 18-2, 18-3, and 18-4; the outputs from SRAM block segment 16-3 intersect the four interconnect conductors of wiring channels 18-2, 18-3, 18-4, and 18-5; and the outputs from SRAM block segment 16-4 intersect the four interconnect conductors of wiring channels 18-3, 18-4, and 18-5, as well as continuing on to a wiring channel located below the bottom of the drawing figure. Those of ordinary skill in the art will recognize that each output conductor could span a number of wiring channels other than four and could also be programmably connected to other interconnect resources, such as longer lines running all or most of a row or column dimension of the array.

The distribution of the inputs and outputs of the SRAM block segments 16-1, 16-2, 16-3, and 16-4 and the pass of the wiring channels through the SRAM blocks 16 allow for optimum interconnect flexibility. The various aspects of this flexibility are illustrated in FIG. 2.

First, the output 6 of SRAM block segment 16-1 is shown connected to an illustrative input of logic function module 12-5 in the same row and to the right of the SRAM block segment 16-1. The two programmed user-programmable interconnect elements (one at the intersection of output 6 of SRAM block segment 16-1 and interconnect conductor 18-2c and the other at the intersection of interconnect conductor 18-2c and the illustrative input conductor of logic function module 12-5) are each represented by an "X" at the appropriate intersection. In addition, output 5 of SRAM block segment 16-1 is shown driving a signal onto interconnect conductor 18-1c. This signal will be used by a module located in another portion of the array not shown in FIG. 2.

Two of the illustrative inputs 1 and 2 of SRAM block segment 16-2 are shown connected to interconnect conductors 18-3a and 18-3b, respectively. As implied by FIG. 2, the sources of the driving signals for inputs 1 and 2 of SRAM block segment 16-2 are located in a portion of the array not illustrated in FIG. 2 and are routed through the general interconnect architecture.

In the third row, an illustrative output of logic function module 12-7, located to the right of SRAM block segment 16-3, is shown driving an illustrative input of logic function module 12-3, located to the right of SRAM block segment 16-3. This is a powerful feature of the present invention, since it permits interconnection of logic function modules located adjacent to the SRAM blocks 16 as if the SRAM blocks 16 were not present, thus rendering the SRAM blocks 16 virtually transparent to the routing resource.

Finally, in the fourth row of the array illustrated in FIG. 2, input 1 of SRAM block segment 16-4 is shown being driven by an illustrative output of logic function module 12-8 via interconnect conductor 18-5a and two programmed user-programmable interconnect elements, while inputs 2, 3, and 4 of SRAM block segment 16-4 are shown being driven from signals on interconnect conductors 18-5b, 18-5c, and 18-5d which have come from other locations in the array.

Figure 3:
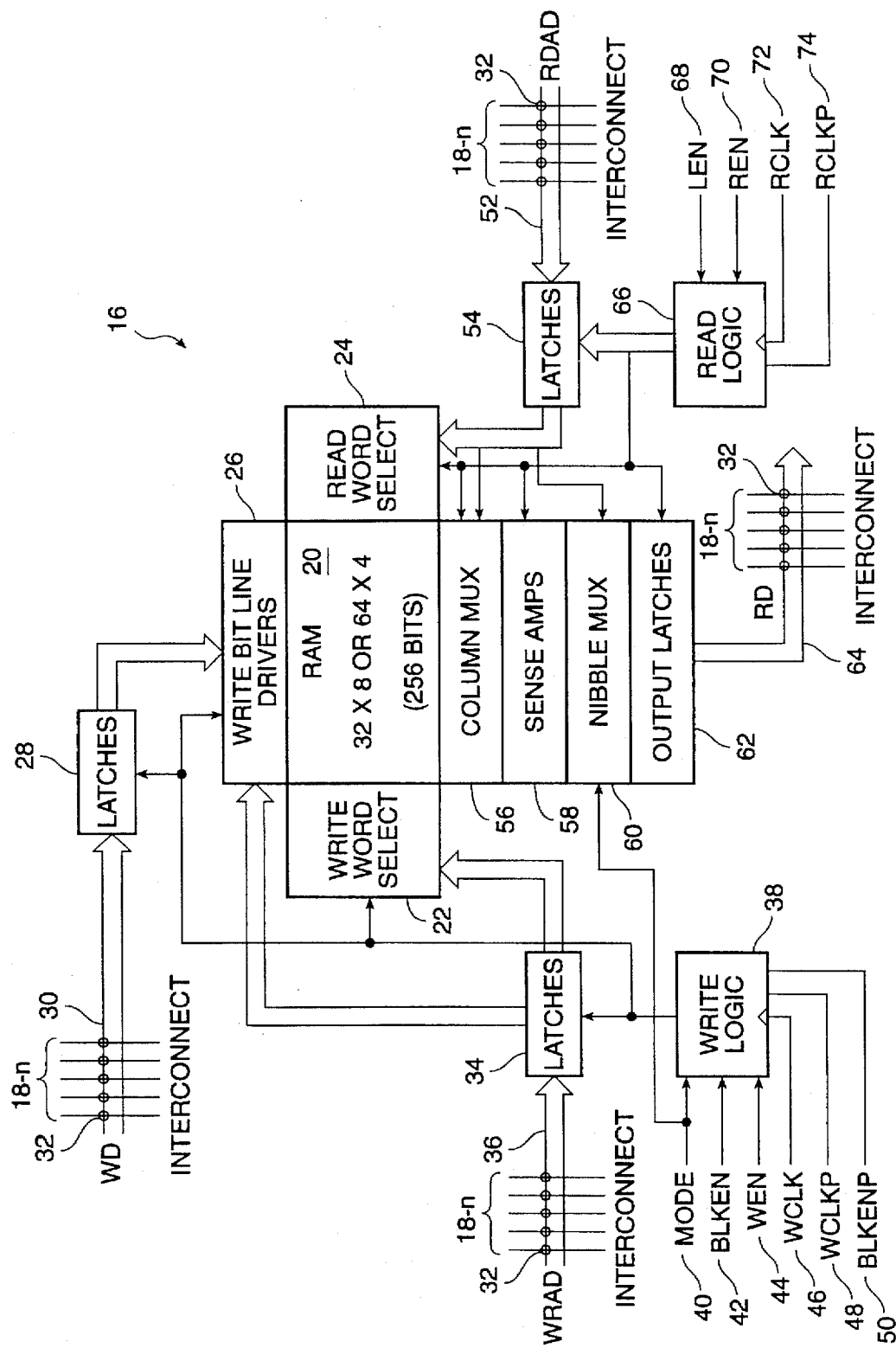
FIG. 3 is a block diagram of a typical SRAM block suitable for use in the architecture of the present invention.

The block diagram of a single SRAM block 16 comprising SRAM block segments 16-1 through 16-4 according to a presently preferred embodiment of the invention is shown in FIG. 3. The SRAM block 16 is preferably dual-ported, permitting simultaneous writes and reads from different addresses. As shown in FIG. 3, the size of the memory is 256 bits, which can preferably be configured with either of two data word widths, for example as 32 8-bit bytes or 64 4-bit nibbles. Those of ordinary skill in the art will readily recognize that the memory size may be other than 256 bits and that the data word width may be other than 8-bit bytes or 4-bit nibbles. The architecture of SRAM components is well known, and persons of ordinary skill in the art will be readily able to design SRAM blocks 16 such as illustrated in FIG. 3 from individual transistors.

Dual-porting the SRAM blocks 16 of the present invention is important for attaining high performance, since it allows the use of a current sensing read scheme which is much faster than the traditional differential voltage sense amplifier used in most single port SRAM designs. Separating the write port from the read port eliminates write recovery times from the read access path, which further enhances the speed. There are several disadvantages of dual porting the SRAM blocks 16 of the preferred embodiment of the present invention. They include the additional decode circuitry required and the additional address lines which increase the routing density around the SRAM block Segments 16-1 through 16-4. The presence of the additional address lines is compensated for by spreading the SRAM block 16 inputs over several routing channels as previously described herein. Reducing the number of data word width modes to two (byte-wide or nibble-wide data words) allows the user some configuration flexibility without significantly increasing control circuitry or harming access time.

As previously disclosed, in its preferred embodiment, the SRAM block 16 of the present invention is distributed over an area normally occupied by four logic function modules in an FPGA array. It has been found optimal to distribute the components of the SRAM block among the four portions 16-1, 16-2, 16-3 and 16-4 in as linear a manner as is practical in any given FPGA layout.

The architecture of the SRAM blocks 16 used in a preferred embodiment of the present invention includes a RAM array 20 communicating with write word select circuit 22 and read word select circuit 24. A row of bit line drivers 26 take the write data from write latches 28 driven by an eight bit write data (WD) bus 30. As shown in FIG. 3, interconnect conductors from wiring channels 18-n are shown intersecting write data bus 30 and are connectable thereto by user-programmable interconnect elements 32 (shown as circles).

The data in write latches 28 is written into an address in RAM array 20 selected by write word select circuit 22 and bit line drivers 26 from the address data present on a 6-bit write address (WRAD) bus 36 which has been latched by write address latch 34. Interconnect conductors from wiring channels 18-n are shown intersecting write address bus 36 and are connectable thereto by user-programmable interconnect elements 32 (shown as circles).

The write operations are controlled by write logic circuit 38 in accordance with its control inputs including MODE control input 40, block enable (BLKEN) input 42, write enable (WEN) input 44, and write clock (WCLK) input 46. The MODE control input 40 sets the byte/nibble setting of the memory address location widths by programming it to the appropriate logic level.

Use of the nibble mode by activating MODE control input 40 requires an additional address line on both ports but reduces the number of data lines by four (4) at each port. The net savings is six signals per SRAM block 16. As numerous SRAM blocks 16 occupy a given column in the presently preferred embodiment of the invention, and since they utilize a common group of vertical routing resources associated with the column, use of the nibble mode can reduce the probability of running out of such resources during automated place and route. Additionally, use of nibble mode may permit automated place and route to choose a preferred set of routing resources which may offer improved speed of operation. Those of ordinary skill in the art will recognize that this provides maximum flexibility and performance.

Input data (WD) on bus 30, write address (WRAD) data on bus 36, and control signals (WEN input 44 and BLKEN input 42) are synchronized to write clock (WCLK) 46. The polarity of the WCLK 46 may selectable by placing a logic 0 or logic 1 at write clock polarity input (WCLKP) 48. As will be appreciated by those of ordinary skill in the art, this may be easily accomplished by feeding the WCLK input 46 to one input of an exclusive-OR gate and tying the WCLKP input 48 to the other input of the gate to logic 0 or logic 1 as is well known in the art. A write operation takes place on the appropriate edge of WCLK input 46 whenever WEN input 44 and BLKEN input 42 are both logic HIGH. The BLKEN input 42, like WCLK input 46, may employ programmable polarity selection as described above using BLKENP input 50.

It will be appreciated that the inputs to write logic circuit 38 are connectable to Interconnect conductors in a wiring channel by user-programmable interconnect elements as depicted in FIG. 2. To avoid over complicating drawing FIG. 3 and unnecessarily obscuring the disclosure, the user-programmable interconnections between the inputs to the write logic circuit 38 and the interconnect conductors are not shown in FIG. 3.

As will be appreciated by those of ordinary skill in the art, programmably selecting the polarity of the BLKEN input 42 to the SRAM block 16 allows two different SRAM blocks 16 programmed with opposite polarity on their BLKEN inputs 42 to effectively have a common seventh address bit. This saves the user from expending modules and routing resources to implement this. The user can still use WEN=0 to disable both blocks.

Synchronizing the timing of the write port to the WCLK input 46 is important because it simplifies the timing for the user. The illustrative write timing for the user of the SRAM block 16 of the present invention is shown in the timing diagram of FIG. 4. All memories (even asynchronous ones) have write timing requirements because address, data, and control signals must be held constant during the duration of a write pulse or false data may be written into the SRAM array. A synchronous write port moves all of the complicated timing relationships, such as the ones normally encountered in SRAM devices of this type and illustrated in FIG. 5, inside the SRAM block 16 relieving the user of the burden of generating a number of timed pulses. Providing polarity select on various control signals as described above allows the user further flexibility in both the logic design and the use of multiple SRAM blocks 16 to construct deeper or wider memories. This little bit of logic can save a considerable amount of logic array resources and helps relieve routing density bottlenecks.

Figure 4:
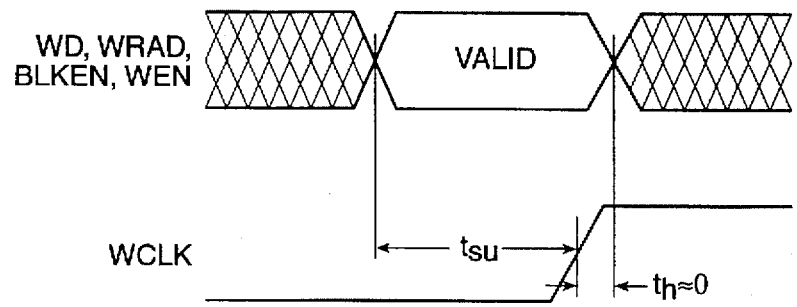
FIG. 4 is a timing diagram showing the timing of the write operation of the SRAM block of FIG. 3.
Figure 5:
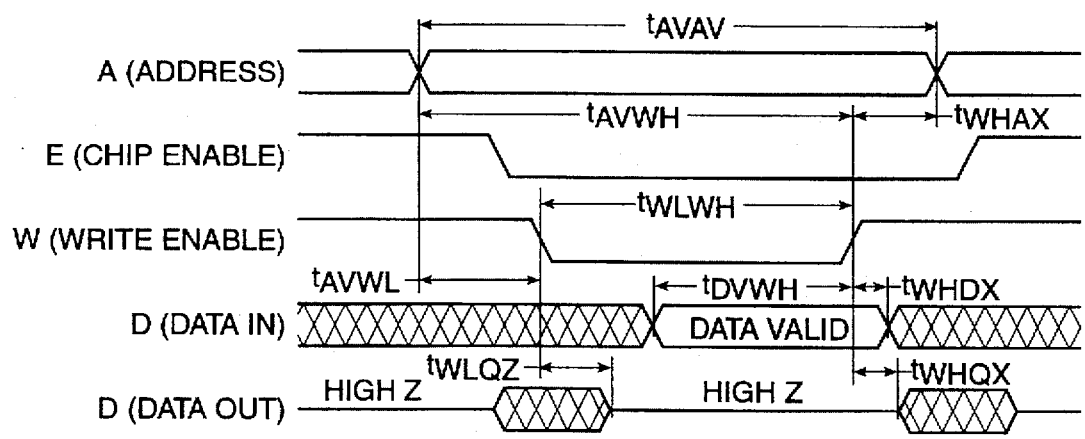
FIG. 5 is a simplified timing diagram showing the typical complex write operation of a level-sensitive commercial SRAM integrated circuit, in contrast to the simple timing of the present invention shown the SRAM block of FIG. 4.

With the synchronous timing of the write port, the latches 28 and 34 each perform as masters to a common slave comprising the write word select circuit 22, the bit line drivers 26 and the selected storage elements of the RAM array 20. This gives the write operation the appearance of simply clocking the data into a D-flip/flop on the active edge of WCLK 46 as illustrated in FIG. 4. Both of the latches 28 and 34 are alternately transparent and latched on opposite phases of the clock. When WCLK input 46 is LOW, latches 28 and 34 are transparent, data is presented to the inputs of the bit line drivers 26 and the location of the data to be written is presented to the inputs of the write word select circuitry 22 and the bit line drivers 26. When WCLK input 46 is brought HIGH, the latches 28 and 34 also latch the state of the WRAD 36 and WD 30 busses, the selected bit line drivers drive the data onto the bit lines of RAM array 20, the write word select circuitry 22 selects the word location where the data is to be stored, and the data is written into the now-transparent latches in the selected memory elements in the RAM array 20. When the WCLK is again brought LOW, the previously selected latches in the RAM array 20 latch the data.

The RAM array 20 may be read by placing a read address on read address bus 52. Interconnect conductors from wiring channels 18-n are shown intersecting read address bus 52 and are connectable thereto by user-programmable interconnect elements 32 (shown as circles). The read address may be latched into read address latch 54. The read address is output from read address latch 54 and presented to read word select circuit 24 to select the the data word to be read from RAM array 20. RAM array 20 drives column multiplexer 56, whose function is to choose select data (data byte) from select memory cells at the memory address selected by read word select circuit 24. The data byte selected by the column multiplexer 56 is output to the sense amplifiers 58 which are driven by the column multiplexer 56. When the SRAM block 16 is in the nibble mode, the nibble multiplexer 60, in response to the mode signal 40 and the address latch 54, further selects data (data nibble) from the data byte being transmitted through the sense amplifiers 58. Otherwise, the nibble multiplexer 60 is transparent. The sense amplifiers 58 drive both the nibble multiplexer 60 and output latches 62 to place the nibble or byte on read data bus 64. Interconnect conductors from wiring channels 18-n are shown intersecting read data bus 64 and are connectable thereto by user-programmable interconnect elements 32 (shown as circles).

The control inputs to read logic 66 on the read side include latch enable (LEN) input 68, read enable (REN) input 70, and read clock (RCLK) 72. On the read side, all eight data outputs on read dat bus 64 will be used for byte mode. For nibble mode only the four lowest-order bits will be connected to other logic via user-programmable interconnect elements. In byte mode the highest order read and write address bits become don't-cares.

According to a presently preferred embodiment of the invention, the read operation may be performed either synchronously or asynchronously. When the read port is synchronous, the read addresses on read address bus 52 and read data on read data bus 64 are synchronized to the RCLK input 72 whenever the output latch enable (LEN) input 68 is programmed to a logic 1. When the read port is asynchronous, the LEN input 68 is programmed LOW and the read address latches 54 and output data latches 62 are forced transparent. In this latter mode, output data will change in response to a change in read address, as opposed to changing in response to an edge on RCLK input 72. As with the WCLK input 46, the RCLK input 72 preferably includes programmable polarity using the RCLKP input 74.

Finally, the read enable (REN) control input 70 of SRAM block 16 in the preferred embodiment of the invention implements a power-down feature. When REN=0 the sense amplifiers 58 are powered down, permitting zero standby power. A hold-state latch preserves the previous state of the read data (RD) despite having the sense amplifiers 58 inactive.

It will be appreciated that the inputs to read logic 66 are connectable to Interconnect conductors in a wiring channel by user-programmable interconnect elements as depicted in FIG. 2. To avoid over complicating drawing FIG. 3 and unnecessarily obscuring the disclosure, the user-programmable interconnections between the inputs to the write logic circuit 38 and the interconnect conductors are not shown in FIG. 3.

Synchronously latching the read address and data signals in SRAM block 16 is important because it allows the user greater flexibility and improved performance. In the synchronous mode, the read address latches 54 are alternately transparent and latched on opposite phases of RCLK 72 and are 180 degrees out of phase relative to the output latches 62. Thus read address latches 54 and output latches 62 perform analogously to the two latches in a master/slave flip/flop. The SRAM block 16 appears to have an internal register allowing pipelined operation (further boosting performance) in high speed systems.

The FPGA architecture described herein offers flexible, high-performance SRAM to the user of FPGAs. The flexibility of the architecture permits efficient implementation of on-chip data storage, register files, and FIFOs. Small-capacity high-speed dual-port SRAM can be used to handle ATM data packets; for DRAM and DMA control; as a "rubber-band" synchronizer between two clocks of differing frequency; and as a coefficient table for FIR and IIR filters (wherein many integer coefficients are stored once and retrieved repeatedly).

By offering many independent blocks, the FPGA can support many different sorts of applications. Unused blocks can be turned into 8-bit registers by fixing the write and read addresses and tying all enables HIGH (except LEN which is tied LOW). On-chip SRAM is many times more efficient for storing data than logic modules and saves many valuable I/0 pins. Thus, the user can fit more logic into, and obtain greater performance from, a given FPGA.

Those of ordinary skill in the art will recognize that the SRAM architecture disclosed herein can also be utilized for FIFO, ROM, and as single port RAM with or without employing a bidirectional data bus.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A field programmable gate array architecture comprising:

a plurality of horizontal routing channels each including a plurality of interconnect conductors, some of said interconnect conductors segmented by user-programmable interconnect elements;

a plurality of vertical routing channels each including a plurality of interconnect conductors forming intersections with interconnect conductors in said horizontal routing channels, some of said interconnect conductors segmented by user-programmable interconnect elements;

user-programmable interconnect elements connected between selected ones of said horizontal and vertical interconnect conductors at selected ones of said intersections;

an array comprising a plurality of rows and columns of logic function modules superimposed on said horizontal and vertical routing channels, each of said logic function modules having at least one input and at least one output, said at least one input and at least one output of said logic function modules connectable to ones of said interconnect conductors in either or both of said horizontal and vertical routing channels;

at least a portion of one column of said array including random access memory blocks disposed in said array in place of logic function modules, said at least a portion of a column adjacent to at least one column of said logic function modules, each of said random access memory blocks spanning a distance of more than one row of said array such that at least one interconnect conductor in more than one horizontal routing channel passes therethrough and is connectable to adjacent logic function modules on either side thereof; each of said random access memory blocks having address inputs, control inputs, data inputs, and data outputs;

user-programmable interconnect elements connected between said address inputs, control inputs, data inputs, and data outputs of said random access memory blocks and selected ones of said interconnect conductors in said more than one horizontal routing channel passing therethrough; and means for programming selected ones of said user-programmable interconnect conductors to connect the at least one input and at least one output of ones of said logic function modules to one another and to the address inputs, control inputs, data inputs, and data outputs of said random access memory blocks.

2. The field programmable gate array architecture of claim 1 wherein said random access memory blocks are dual ported static random access memory blocks.

3. The field programmable gate array architecture of claim 1 wherein one of said control inputs of said random access memory blocks is a mode control input for selecting between a first data bus width and a second data bus width.

4. The field programmable gate array architecture of claim 3 wherein said first data bus width is eight bits and said second data bus width is four bits.

5. The field programmable gate array architecture of claim 1 wherein one of said control inputs of said random access memory blocks is a write clock input polarity control input having two states, a first state in which write operations are initiated on a rising edge of a write clock input to said random access memory blocks and a second state in which write operations are initiated on a falling edge of said write clock input.

6. The field programmable gate array architecture of claim 1 wherein said random access memory blocks include a block enable input for enabling said random access memory blocks and wherein one of said control inputs of said random access memory blocks is a block enable input polarity control input having two states, a first state in which said random access memory blocks are enabled by a logic high signal on said block enable input to said random access memory blocks and a second state in which said random access memory blocks are enabled by a logic low signal on said block enable input.

7. The field programmable gate array architecture of claim 1 wherein said random access memory blocks include read address latches and read data output latches, each of said read address latches and read data output latches having a transparent state and a latched state, the transparent states and the latched states of the read address latches and read data output latches being responsive to opposite logic states of a read clock input to said random access memory blocks.

8. A field programmable gate array architecture comprising:

a plurality of horizontal routing channels each including a plurality of interconnect conductors, some of said interconnect conductors segmented by user-programmable interconnect elements;

a plurality of vertical routing channels each including a plurality of interconnect conductors forming intersections with interconnect conductors in said horizontal routing channels, some of said interconnect conductors segmented by user-programmable interconnect elements;

user-programmable interconnect elements connected between selected ones of said horizontal and vertical interconnect conductors at selected ones of said intersections;

an array comprising a plurality of rows and columns of logic function modules superimposed on said horizontal and vertical routing channels, each of said logic function modules having at least one input and at least one output, said at least one input and at least one output of said logic function modules connectable to ones of said interconnect conductors in either or both of said horizontal and vertical routing channels;

at least a portion of more than one column of said array including random access memory blocks disposed in said array in place of logic function modules, said at least a portion of more than one column adjacent to at least one column of said logic function modules, each of said random access memory blocks spanning a distance of more than one row of said array such that at least one interconnect conductor in more than one horizontal routing channel passes therethrough and is connectable to adjacent logic function modules on either side thereof; each of said random access memory blocks having address inputs, control inputs, data inputs, and data outputs;

user-programmable interconnect elements connected between said address inputs, control inputs, data inputs, and data outputs of said random access memory blocks and selected ones of said interconnect conductors in said more than one horizontal routing channel passing therethrough; and means for programming selected ones of said user-programmable interconnect conductors to connect the at least one input and at least one output of ones of said logic function modules to one another and to the address inputs, control inputs, data inputs, and data outputs of said random access memory blocks.

9. The field programmable gate array architecture of claim 8 wherein said random access memory blocks are dual ported static random access memory blocks.

10. The field programmable gate array architecture of claim 8 wherein one of said control inputs of said random access memory blocks is a mode control input for selecting between a first data bus width and a second data bus width.

11. The field programmable gate array architecture of claim 10 wherein said first data bus width is eight bits and said second data bus width is four bits.

12. The field programmable gate array architecture of claim 8 wherein one of said control inputs of said random access memory blocks is a write clock input polarity control input having two states, a first state in which write operations are initiated on a rising edge of a write clock input to said random access memory blocks and a second state in which write operations are initiated on a falling edge of said write clock input.

13. The field programmable gate array architecture of claim 8 wherein said random access memory blocks include a block enable input for enabling said random access memory blocks and wherein one of said control inputs of said random access memory blocks is a block enable input polarity control input having two states, a first state in which said random access memory blocks are enabled by a logic high signal on said block enable input to said random access memory blocks and a second state in which said random access memory blocks are enabled by a logic low signal on said block enable input.

14. The field programmable gate array architecture of claim 8 wherein said random access memory blocks include read address latches and read data output latches, each of said read address latches and read data output latches having a transparent state and a latched state, the transparent states and the latched states of the read address latches and read data output latches being responsive to opposite logic states of a read clock input to said random access memory blocks.

* * * * *

(12) EX PARTE REEXAMINATION CERTIFICATE (7788th)
United States Patent
McGowan et al.

(10) Number: US 5,744,980 C1
(45) Certificate Issued: Oct. 5, 2010

(54) FLEXIBLE, HIGH-PERFORMANCE STATIC RAM ARCHITECTURE FOR FIELD-PROGRAMMABLE GATE ARRAYS

(75) Inventors: John E. McGowan, Sunnyvale, CA (US); William C. Plants, Santa Clara, CA (US); Joel D. Landry, Colorado Springs, CO (US); Sinan Kaptanoglu, San Carlos, CA (US); Warren K. Miller, Palo Alto, CA (US)

(73) Assignee: Actel Corporation, Sunnyvale, CA (US)

Reexamination Request:
No. 90/007,710, Sep. 7, 2005

Reexamination Certificate for:
Patent No.: 5,744,980
Issued: Apr. 28, 1998
Appl. No.: 08/603,597
Filed: Feb. 16, 1996

(51) Int. Cl.
*H03K 19/177* (2006.01)

(52) U.S. Cl. .............................. 326/40; 326/41
(58) Field of Classification Search ................ None
See application file for complete search history.

(56) References Cited

U.S. PATENT DOCUMENTS

| | | | |
|---|---|---|---|
| 4,780,846 A | 10/1988 | Tanabe et al. |
| 4,825,414 A | 4/1989 | Kawata |
| 4,855,958 A | 8/1989 | Ikeda |
| 4,959,704 A | 9/1990 | Isomura et al. |
| 5,014,235 A | 5/1991 | Morton |
| 5,103,282 A | 4/1992 | Isomura et al. |
| 5,243,208 A | 9/1993 | Isomura et al. |
| 5,255,217 A | 10/1993 | Tan |
| 5,259,063 A | 11/1993 | Salazar |
| 5,315,178 A | 5/1994 | Snider |
| 5,321,664 A | 6/1994 | Akimoto |
| 5,361,370 A | 11/1994 | Sprague et al. |
| 5,432,719 A | 7/1995 | Freeman et al. |
| 5,477,067 A | 12/1995 | Isomura et al. |
| 5,512,766 A | 4/1996 | Kusunoki |

(Continued)

FOREIGN PATENT DOCUMENTS

EP 0 033 914 A2 8/1981

(Continued)

OTHER PUBLICATIONS

Abstract of JP 07–177008, Hewlett Packard Co, Jul. 14, 1995.
Abstract of JP 1–272149, Hitachi Ltd., Oct. 31, 1989.
Abstract of JP 2–161819, Sharp KK, Jun. 21, 1990.
Abstract of JP 2–194649, Fujitsu Ltd, Aug. 1, 1990.

(Continued)

*Primary Examiner*—Margaret Rubin

(57) ABSTRACT

A field programmable gate array architecture comprises a plurality of horizontal and vertical routing channels each including a plurality of interconnect conductors. Some interconnect conductors are segmented by user-programmable interconnect elements, and some horizontal and vertical interconnect conductors are connectable by user-programmable interconnect elements located at selected intersections between them. An array of rows and columns of logic function modules each having at least one input and one output is superimposed on the routing channels. The inputs and outputs of the logic function modules are connectable to ones of the interconnect conductors in either or both of the horizontal and vertical routing channels. At least one column of random access memory blocks is disposed in the array. Each random access memory block spans a distance of more than one row of the array such that more than one horizontal routing channel passes therethrough and is connectable to adjacent logic function modules on either side thereof. Each of the random access memory blocks has address inputs, control inputs, data inputs, and data outputs. User-programmable interconnect elements are connected between the address inputs, control inputs, data inputs, and data outputs of the random access memory blocks and selected ones of the interconnect conductors in the horizontal routing channels passing therethrough. Programming circuitry is provided for programming selected ones of the user-programmable interconnect conductors to connect the inputs and outputs of the logic function modules to one another and to the address inputs, control inputs, data inputs, and data outputs of the random access memory blocks.

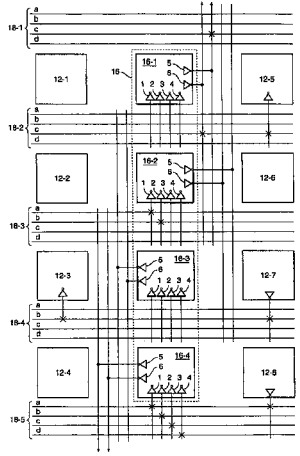

U.S. PATENT DOCUMENTS

| | | |
|---|---|---|
| 5,530,884 A | 6/1996 | Sprague et al. |
| 5,546,347 A | 8/1996 | Ko et al. |
| 5,550,782 A | 8/1996 | Cliff et al. |
| 5,581,199 A | 12/1996 | Pierce et al. |
| 5,760,604 A | 6/1998 | Pierce et al. |
| 5,801,546 A | 9/1998 | Pierce et al. |
| 5,801,547 A | 9/1998 | Keane |
| 5,809,281 A | 9/1998 | Steele et al. |
| 5,898,636 A | 4/1999 | Isomura et al. |
| 5,933,023 A | 8/1999 | Young |

FOREIGN PATENT DOCUMENTS

| | | |
|---|---|---|
| EP | 0 229 932 B1 | 7/1985 |
| EP | 0 170 052 A2 | 2/1986 |
| EP | 0 229 932 A2 | 7/1987 |
| EP | 0 364 743 A1 | 4/1990 |
| EP | 0 376 905 | 7/1990 |
| EP | 0 420 389 A1 | 4/1991 |
| EP | 0 420 390 A2 | 4/1991 |
| EP | 0 450 811 A2 | 10/1991 |
| EP | 0 454 352 A1 | 10/1991 |
| EP | 0 170 052 B1 | 4/1992 |
| EP | 0 304 286 B1 | 10/1993 |
| EP | 0 364 743 B1 | 5/1997 |
| JP | 60-64447 | 4/1985 |
| JP | 61-22649 | 1/1986 |
| JP | 61097849 | 5/1986 |
| JP | 61-123154 | 6/1986 |
| JP | 63-293966 | 11/1988 |
| JP | 64-48445 | 2/1989 |
| JP | 2-205342 | 8/1990 |
| JP | 2505039 B2 * | 6/1996 |

OTHER PUBLICATIONS

Abstract of JP 2–205342, Fujitsu Ltd., Aug. 15, 1990.
Abstract of JP 4–253370, Nippon Electric IC Microcomputer, Sep. 9, 1992.
Abstract of JP 4 280473, Nippon Electric Co, Oct. 6, 1992.
Abstract of JP 63–037632 A, NEC Corp, Feb. 18, 1988.
Abstract of JP 8–265136, Xilinx Inc., Oct. 11, 1996.
Abstract of JP 58–082533, Hitachi Ltd., Hitachi Microcomputer Eng., May 18, 1983.
Abstract of JP 59–117132, Nippon Electric Co, Jul. 6, 1984.
Abstract of JP 59–232441, Suwa Seikosha KK, Dec. 27, 1984.
Abstract of JP 60–066446, Fujitsu Ltd, Apr. 16, 1985.
Abstract of JP 60–134436, Hitachi Ltd, Jul. 17, 1985.
Abstract of JP 61–097849, Fujitsu Ltd, May 16, 1986.
Abstract of JP 63–037632, Nippon Electric Co., Feb. 18, 1988.
Abstract of JP 63–178543, Ricoh KK, Jul. 22, 1988.
Xilinx, 1994 Data Book, p. 2–13.
Fujitsu, "CMOS Channelless Gate Arrays", 1989 Data Book, pp. 2–402 to 2–409.
Hsieh, et al., "Third–Generation Architecture Boosts Speed and Density of Field–Programmable Gate Arrays", IEEE, 1990, Custom Integrated Circuits Conference, pp. 31.2.1–31.2.7.
Cartier, "Implementing FIFOs in C4X000E RAM", Xilinx, Inc., pp. 1–15.
Ron Wilson, "Altera Puts Memory Into Its Flex PLDs", Electronic Engineering Times, pp. 1 & 108.
"Embedded Programmable Architecture Targets Mainstream ASIC Designers", Apr., 1995, Computer Design, pp. 80 & 96.

"Altera Targets High–End ASIC Designs with Flex 10K Architecture", news release Business Wire, Mar. 20, 1995, pp. 1–2.
"Flex10K Embedded Programmable Logic Family", Altera Corporation, Preliminary Information, pp. 6–9.
Kawana, et al., "An Efficient Logic Block Interconnect Architecture for User–Reprogrammable Gate Array", 1990, IEEE, custom Integrated Circuits Conference, pp. 31.3.1–31.3.4.
"Interconnect Technology Dictates Architecture Choices in FPGAs," Vacit Arat, WESCON/'93 Conference Record, 1993.
A 51K–Gate Low Power ECL Gate Array Family wtih Metal–Compiled and Embedded SRAM, D. Gray et al. , IEEE 1993 Custom Integrated Circuits Conference (1993).
"An MPGA Compatible FPGA Architecture," David Marple and Larry Cooke, IEEE Custom Integrated Circuits Conference (1992).
"A Low Power Programmable Logic Device Reconfigurable for 3.3V or 5.0V Operation During and After Fabrication," Cameron McClintock, et al., IEEE 1994 Custom Integrated Circuits Conference, (1994).
"Architecture of Centralized Field–Configurable Memory," Steven J.E. Wilton, et al., International Symposium on Field Programmable Gate Arrays Proceedings of 1995.
"SRAM Blocks and Antifuse Logic Combine In New FPGAs," Dave Bursky, Electronic Design (1995).
"A 1.5–ns Cycle–Time 18–kb Pseudo–Dual–Port RAM with 9K Logic Gates," Masto Iwabuchi, et al., IEEE Journal of Solid State Circuits (1994).
"A Wafer–Scale–Level System Integrated LSI Containing Eleven 4–Mb DRAM's, six 64–kb SRAM's, and an 18K–Gate Array," K. Sato, et al., IEEE Journal of Solid State Circuits (1992).
"A High Density Embedded Array Programmable Logic Architecture," Srinivas Reddy, et al., IEEE 1996 Custom Integrated Circuits Conference (1996).
"Memory/Logic Interconnect Flexibility in FPGA's with Large Embedded Memory Arrays," Steven J.E. Wilton, et al., IEEE 1996 Custom Integrated Circuits Conference (1996).
"Intel's FLEXlogic FPGA Architecture," Daniel E. Smith, Programmable Logic Devices (1993).
"A 7ns 128K Multichip ECL RAM–with–Logic Module," Masato Iwabuchi, et al., 1987 IEEE International Solid State Circuits Conference (1987).
"A 36kb/2ns RAM with 1kG/100ps Logic Gate Array," Satoru Isomura, 1989 IEEE International Solid State Circuits Conference (1989).
"*A Soft–Error–Immune 0.9–ns 1.15–Mb ECL–CMOS SRAM with 30–ps 120 K Logic Gates and On–Chip Test Circuitry,*" Higeta et al., Proceedings of the 1995 Bipolar/BiCMOS Circuits and Technology Meeting, Oct. 1995 ("Higeta"); pp. 47–50.
"*0.6um 12K Gate Array With RAM and ROM,*" Nishimura et al., IEEE 1989 Custom Integrated Circuits Conference (1989) ("Nishimura").
"*A 290K–Transistor ECL Gate Array with RAM,*" Satoh et al., 1989 IEEE International Solid–State Circuits Conference (1989) ("Satoh"); pp. 184–186.
"*A 0.8μm 29,000 Gate BiCMOS—ECL Mixed Array With 40kb/5ns Embedded SRAM,*" Yung et al., IEEE (1991) ("Yung"), pp. 9–7.1–9–7.4.

* cited by examiner

US 5,744,980 C1

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-14 is confirmed.

New claims 15-28 are added and determined to be patentable.

*15. A field programmable gate array architecture comprising:*
  *a plurality of horizontal routing channels, each horizontal routing channel including a plurality of horizontal interconnect conductors, wherein some of the horizontal interconnect conductors are segmented by user-programmable interconnect elements;*
  *a plurality of vertical routing channels, each vertical routing channel including a plurality of vertical interconnect conductors forming intersections with the horizontal interconnect conductors in the horizontal routing channels, wherein some of the vertical interconnect conductors are segmented by user-programmable interconnect elements;*
  *user-programmable interconnect elements connected between selected ones of the horizontal interconnect conductors and vertical interconnect conductors at selected ones of the intersections;*
  *an array comprising:*
    *a plurality of rows and a plurality of columns of logic function modules superimposed on the horizontal and vertical routing channels, wherein:*
    *each of the logic function modules has at least one input and at least one output, the at least one input and at least one output of the logic function modules connectable to ones of the interconnect conductors in either or both of the horizontal and vertical routing channels;*
    *at least a portion of one column of the array includes random access memory blocks disposed in the array in place of logic function modules, wherein:*
    *the at least a portion of one column of the array including the random access memory blocks is adjacent to at least one column of the logic function modules, wherein:*
    *each of the random access memory blocks has address inputs, control inputs, data inputs, and data outputs; and*
    *each of the random access memory blocks spans a distance of more than one row of the array such that at least two horizontal routing channels each include at least two interconnect conductors that pass through the random access memory block; and*
    *each of the at least two interconnect conductors passing through the random access memory block are connectable to:*
      *adjacent logic function modules on one side of the random access memory block; and*
      *adjacent logic function modules on an opposite side of the random access memory block; and*
    *user-programmable interconnect elements are connected between: the address inputs, control inputs, data inputs, and data outputs of each of the random access memory blocks; and selected ones of the at least two interconnect conductors in at least two horizontal routing channels passing through the random access memory blocks; and*
    *means for programming selected ones of said user-programmable interconnect elements to connect the at least one input and at least one output of ones of said logic function modules to one another and to the address inputs, control inputs, data inputs, and data outputs of said random access memory blocks; wherein:*
    *the means for programming includes programming circuitry.*

*16. The field programmable gate array architecture of claim 15 wherein said random access memory blocks are dual ported static random access memory blocks.*

*17. The field programmable gate array architecture of claim 15 wherein one of said control inputs of said random access memory blocks is a mode control input for selecting between a first data bus width and a second data bus width.*

*18. The field programmable gate array architecture of claim 17 wherein said first data bus width is eight bits and said second data bus width is four bits.*

*19. The field programmable gate array architecture of claim 15 wherein one of said control inputs of said random access memory blocks is a write clock input polarity control input having two states, a first state in which write operations are initiated on a rising edge of a write clock input to said random access memory blocks and a second state in which write operations are initiated on a falling edge of said write clock input.*

*20. The field programmable gate array architecture of claim 15 wherein said random access memory blocks include a block enable input for enabling said random access memory blocks and wherein one of said control inputs of said random access memory blocks is a block enable input polarity control input having two states, a first state in which said random access memory blocks are enabled by a logic high signal on said block enable input to said random access memory blocks and a second state in which said random access memory blocks are enabled by a logic low signal on said block enable input.*

*21. The field programmable gate array architecture of claim 15 wherein said random access memory blocks include a read address latches and read data output latches, each of said read address latches and read data output latches having a transparent state and a latched state, the transparent states and the latched states of the read address latches and read data output latches being responsive to opposite logic states of a read clock input to said random access memory blocks.*

*22. A field programmable gate array architecture comprising:*
  *a plurality of horizontal routing channels, each horizontal routing channel including a plurality of horizontal interconnect conductors, wherein some of the horizontal interconnect conductors are segmented by user-programmable interconnect elements;*
  *a plurality of vertical routing channels, each vertical routing channel including a plurality of vertical intercon-* nect conductors forming intersections with the horizontal interconnect conductors in the horizontal routing channels, wherein some of the vertical interconnect conductors are segmented by user-programmable interconnect elements;

user-programmable interconnect elements connected between selected ones of the horizontal interconnect conductors and vertical interconnect conductors at selected ones of the intersections;

an array comprising:

a plurality of rows and a plurality of columns of logic function modules superimposed on the horizontal and vertical routing channels, wherein:

each of the logic function modules has at least one input and at least one output, the at least one input and at least one output of the logic function modules are connectable to ones of the interconnect conductors in either or both of the horizontal and vertical routing channels;

at least a portion of one column of the array includes random access memory blocks disposed in the array in place of logic function modules, wherein:

the at least a portion of more than one column the array including the random access memory blocks is adjacent to at least one column of the logic function modules, wherein:

each of the random access memory blocks has address inputs, control inputs, data inputs, and data outputs; and each of the random access memory blocks spans a distance of more than one row of the array such that at least two horizontal routing channels each include at least two interconnect conductors that pass through the random access memory block; and each of the at least two interconnect conductors passing through the random access memory block are connectable to:

adjacent logic function modules on one side of the random access memory block; and adjacent logic function modules on an opposite side of the random access memory block; and user-programmable interconnect elements are connected between: the address inputs, control inputs, data inputs, and data outputs of each of the random access memory blocks; and selected ones of the at least two interconnect conductors in at least two horizontal routing channels passing through the random access memory blocks; and means for programming selected ones of said user-programmable interconnect elements to connect the at least one input and at least one output of ones of said logic function modules to one another and to the address inputs, control inputs, data inputs, and data outputs of said random access memory blocks; wherein:

the means for programming is programming circuitry.

23. The field programmable gate array architecture of claim 22 wherein said random access memory blocks are dual ported static random access memory blocks.

24. The field programmable gate array architecture of claim 22 wherein one of said control inputs of said random access memory blocks is a mode control input for selecting between a first data bus width and a second data bus width.

25. The field programmable gate array architecture of claim 24 wherein said first data bus width is eight bits and said second data bus width is four bits.

26. The field programmable gate array architecture of claim 22 wherein one of said control inputs of said random access memory blocks is a write clock input polarity control input having two states, a first state in which write operations are initiated on a rising edge of a write clock input to said random access memory blocks and a second state in which write operations are initiated on a falling edge of said write clock input.

27. The field programmable gate array architecture of claim 22 wherein said random access memory blocks include a block enable input for enabling said random access memory blocks and wherein one of said control inputs of said random access memory blocks is a block enable input polarity control input having two states, a first state in which said random access memory blocks are enabled by a logic high signal on said block enable input to said random access memory blocks and a second state in which said random access memory blocks are enabled by a logic low signal on said block enable input.

28. The field programmable gate array architecture of claim 22 wherein said random access memory blocks include read address latches and read data output latches, each of said read address latches and read data output latches having a transparent state and a latched state, the transparent states and the latched states of the read address latches and read data output latches being responsive to opposite logic states of a read clock input to said random access memory blocks.

* * * * *